United States Patent
Ziltener et al.

(10) Patent No.: US 10,096,731 B2
(45) Date of Patent: Oct. 9, 2018

(54) METHOD FOR THIN-FILM VIA SEGMENTS IN PHOTOVOLTAIC DEVICE

(71) Applicant: FLISOM AG, Dubendorf (CH)

(72) Inventors: Roger Ziltener, Sursee (CH); Thomas Netter, Winterthur (CH)

(73) Assignee: FLISOM AG, Duebendorf (CH)

( * ) Notice: Subject to any disclaimer, the term of this patent is extended or adjusted under 35 U.S.C. 154(b) by 0 days.

(21) Appl. No.: 15/111,975

(22) PCT Filed: Jan. 26, 2015

(86) PCT No.: PCT/IB2015/050555
§ 371 (c)(1),
(2) Date: Jul. 15, 2016

(87) PCT Pub. No.: WO2015/114498
PCT Pub. Date: Aug. 6, 2015

(65) Prior Publication Data
US 2016/0359065 A1     Dec. 8, 2016

(30) Foreign Application Priority Data

Jan. 31, 2014  (WO) .................. PCT/IB2014/058708
Dec. 31, 2014  (WO) .................. PCT/EP2014/025031

(51) Int. Cl.
*H01L 31/18*     (2006.01)
*H01L 31/0725*   (2012.01)
(Continued)

(52) U.S. Cl.
CPC ...... *H01L 31/0463* (2014.12); *H01L 31/0749* (2013.01); *H01L 31/18* (2013.01); *Y02E 10/541* (2013.01); *Y02P 70/521* (2015.11)

(58) Field of Classification Search
CPC . H01L 31/0463; H01L 31/18; H01L 31/0749; Y02P 70/521; Y02E 10/541
(Continued)

(56) References Cited

U.S. PATENT DOCUMENTS

| 4,697,041 | A | 9/1987 | Okaniwa et al. |
| 4,965,655 | A | 10/1990 | Grimmer et al. |

(Continued)

FOREIGN PATENT DOCUMENTS

| EP | 0 422 511 A2 | 4/1991 |
| EP | 0 478 839 A1 | 4/1992 |

(Continued)

OTHER PUBLICATIONS

Wehrmann A et al: "Change of electrical properties of CIGS thin-film solar cells after structuring with ultrashort laser pulses". Laser-Based Micro- and Nanopackaging and Assembly V. SPIE, 1000 20th St. Bellingham WA 98225-6705 USA, vol. 7921, No. 1. Feb. 10, 2011 (Feb. 10, 2011), pp. 1-14, XP0600005951.

(Continued)

*Primary Examiner* — Joseph C Nicely
*Assistant Examiner* — Thai T Vuong
(74) *Attorney, Agent, or Firm* — Patterson & Sheridan, LLP

(57) ABSTRACT

A method for vias and monolithic interconnects in thin-film optoelectronic devices (100, 200) wherein at least one line segment via hole (163, 165, 165', 167) is formed by laser drilling and passes through front-contact layers (150, 152, 154, 156, 158) and semiconductive active layer (130), and wherein laser drilling causes forming a CIGS-type wall (132, 134, 136, 138) of electrically conductive permanently metalized copper-rich CIGS-type alloy at the inner surface (135) of the via hole, thereby forming a conductive path between at least a portion of front-contact and a portion of (Continued)

back-contact layers (120, 124, 126, 128, 129), forming a bump-shaped raised portion (155) at the surface of the front-contact layer, forming a raised portion (125, 127, 127') of the back-contact layer, and optionally forming a raised portion of copper-rich CIGS-type alloy (155') covering a portion of the front-contact layer (150). A thin-film CIGS device comprises at least one line segment via hole obtainable by the method.

20 Claims, 3 Drawing Sheets

(51) Int. Cl.
H01L 31/0687 (2012.01)
H01L 31/0352 (2006.01)
H01L 31/0463 (2014.01)
H01L 31/0749 (2012.01)

(58) Field of Classification Search
USPC .......................................................... 438/74
See application file for complete search history.

(56) References Cited

U.S. PATENT DOCUMENTS

| | | | |
|---|---|---|---|
| 6,011,215 A | 1/2000 | Glatfelter et al. | |
| 6,300,593 B1 | 10/2001 | Powell | |
| 6,372,538 B1 | 4/2002 | Wendt et al. | |
| 6,919,530 B2 | 7/2005 | Borgeson et al. | |
| 7,276,724 B2 | 10/2007 | Sheats et al. | |
| 7,512,297 B2 | 3/2009 | Farah | |
| 7,635,810 B2 | 12/2009 | Luch | |
| 7,649,141 B2 | 1/2010 | Schmit et al. | |
| 7,732,243 B2 | 6/2010 | Luch | |
| 7,838,868 B2 | 11/2010 | Sheats et al. | |
| 7,964,791 B2 | 6/2011 | Yonezawa et al. | |
| 7,998,838 B2 | 8/2011 | Rekow et al. | |
| 8,048,706 B1 | 11/2011 | Ghandour et al. | |
| 8,153,889 B2 | 4/2012 | Basol | |
| 8,158,514 B2 | 4/2012 | Kruger et al. | |
| 8,263,494 B2 | 9/2012 | Patterson | |
| 8,329,496 B2 | 12/2012 | Ghandour | |
| 8,569,094 B2 | 10/2013 | Stolt et al. | |
| 8,716,591 B2 | 5/2014 | Misra et al. | |
| 2004/0261839 A1 | 12/2004 | Gee et al. | |
| 2007/0145024 A1* | 6/2007 | Salama .............. B23K 26/0734 219/121.71 |
| 2008/0023065 A1 | 1/2008 | Borden et al. | |
| 2008/0314439 A1 | 12/2008 | Misra | |
| 2009/0065060 A1 | 3/2009 | Yonezawa et al. | |
| 2009/0145472 A1* | 6/2009 | Li ..................... H01L 31/03923 136/244 |
| 2009/0229666 A1 | 9/2009 | Corneille et al. | |
| 2009/0301543 A1 | 12/2009 | Reddy et al. | |
| 2009/0301549 A1* | 12/2009 | Moslehi ................ H01L 31/042 136/251 |
| 2010/0000589 A1* | 1/2010 | Kiss ................... H01L 31/03923 136/244 |
| 2010/0147356 A1 | 6/2010 | Britt | |
| 2011/0041890 A1 | 2/2011 | Sheats | |
| 2011/0048506 A1 | 3/2011 | Pichler | |
| 2012/0000502 A1 | 1/2012 | Wiedeman et al. | |
| 2012/0094425 A1 | 4/2012 | Ghandour et al. | |
| 2012/0240995 A1 | 9/2012 | Coakley | |
| 2013/0000715 A1 | 1/2013 | Moslehi et al. | |
| 2013/0056758 A1* | 3/2013 | Ziltener .............. H01L 31/0296 257/88 |
| 2013/0199606 A1* | 8/2013 | Sheng ............. H01L 31/022425 136/256 |
| 2013/0228215 A1* | 9/2013 | Ha ........................ H01L 31/068 136/255 |

FOREIGN PATENT DOCUMENTS

| | | |
|---|---|---|
| EP | 2 437 317 A2 | 4/2012 |
| JP | 02043776 | 2/1990 |
| JP | 2009529805 A | 8/2009 |
| WO | 2006126590 A1 | 11/2006 |
| WO | 2007106756 A2 | 9/2007 |
| WO | 2009084888 A2 | 7/2009 |
| WO | 2010032465 A1 | 3/2010 |
| WO | 2011148346 | 12/2011 |
| WO | 2012/048872 A1 | 4/2012 |
| WO | 2013150418 | 10/2013 |

OTHER PUBLICATIONS

Wennerberg et al. "Cu (In, Ga) Se2-Based Thin-Film Photovoltaic Modules Optimized for Long-Term Performance", Solar Energy Materials & Solar Cells 75 (2003) 47-55.

Westin et al. Laser Patterning in P2 Interconnect via in thin-film CIGS PV modules, Solar Energy Materials and Solar Cells, vol. 92, Issue 10, Oct. 2008, pp. 1230-1235, ISSN 0927-0248, http://dx.doi.org/10.1016/j.solmat.2008.04.015.

JP Office Action dated Sep. 17, 2014 for Application No. 2013-511781.

English Translation of JP Office Action dated Sep. 17, 2014 for Application No. 2013-511781.

* cited by examiner

METHOD FOR THIN-FILM VIA SEGMENTS IN PHOTOVOLTAIC DEVICE

TECHNICAL FIELD

The present invention relates to vias and monolithic interconnects in thin-film optoelectronic devices such as between cells of photovoltaic modules.

BACKGROUND ART

Thin-film photovoltaic modules are generally composed of a number of electrically interconnected optoelectronic components. Such components may be optoelectronic devices such as photovoltaic cells and additional optional components such as diodes and other electronic devices. Photovoltaic modules usually also include electrically interconnecting components such as cell-to-cell connectors and busbars.

Multilayer thin-film technologies enable the monolithic integration and interconnection of several optoelectronic components and associated components on a same substrate. This integration is produced in situ using a sequence of layer deposition and scribing techniques. Thin-film optoelectronic or photovoltaic components or devices are essentially composed of a stack of three material layers: a conducting back-contact electrode layer, a semiconductive photovoltaic material layer, also known as the absorber, and another conducting front-contact electrode layer, said front-contact layer usually being transparent. Photovoltaic cells based on semiconductive material, such as $Cu(In,Ga)Se_2$, which is abbreviated CIGS, show a high potential for less expensive solar electricity, lower energy payback time, and improved life-cycle impact compared to traditional wafer-based silicon photovoltaic devices or solar cells.

Compared to wafer-based photovoltaic devices, monolithic photovoltaic modules may have lower costs thanks to reduced material quantities used to form the thin films that form part of the photovoltaic components, reduced labor costs of monolithic integration, and ease of automatic production of large quantities of photovoltaic modules, for example using roll-to-roll manufacturing techniques. Further savings can be obtained by increasing the relative area of the photovoltaic components exposed to light, for example, by reducing the area occupied by front-contact grids that collect current over the photovoltaic cell's front-contact electrode, electrical interconnects between optoelectronic components and busbars. Photovoltaic module production yields may also be increased thanks to a reduction in the number of production steps, for example by reducing the number of scribing operations needed to delineate and structure the interconnects of optoelectronic components in thin-film monolithic photovoltaic modules.

U.S. Pat. No. 7,276,724 describes series-interconnected optoelectronic device modules thanks to the forming of wrap-through vias, for example using laser ablation, and the addition of conductive material to drive current between electrodes as well as to adjacent modules. Wrap-through vias usually require drilling and subsequent metalizing. This requires additional production steps which may add costs and decrease yield. Some of these steps are avoided with the monolithic optoelectronic module production method of WO2011/148346 which describes forming via holes with copper-rich CIGS-type walls derived from partial melting of the absorber layer's CIGS material.

For some applications, there is a need for a thin-film optoelectronic device and a method of forming the same that comprises via holes shaped as line segments and variations thereof.

SUMMARY OF INVENTION

A problem in the field of monolithic photovoltaic module production relates to reliably manufacturing highly conductive via hole interconnects between photovoltaic components, such as photovoltaic cells. Embodiments provided herein may include a method to reliably interconnect cells of thin-film monolithic photovoltaic module apparatuses at decreased cost and high production yield. The method can also be used to manufacture interconnects between various components of monolithic photovoltaic modules that may comprise photovoltaic cells, diodes, grids, and busbars. The method's speed and large processing window are advantageous to industrial production of monolithic photovoltaic module apparatuses using roll-to-roll production methods. Embodiments of the disclosure provided herein may further comprise a thin-film optoelectronic device that has via hole line segments and a method of reliably manufacturing such line segments at a high speed.

A problem in the field of manufacturing of monolithic interconnects using lasers is that the processing window requires very careful adjustment of laser scribing parameters, even more so when laser scribing photovoltaic materials are formed on a flexible substrate.

A further problem, which is accentuated when laser scribing photovoltaic materials formed on a flexible substrate, is that monolithic interconnects may exhibit variations in the manufactured repeatability of their conductivity.

Yet another problem is that laser scribing may damage various layers of the photovoltaic material and cause cracks and local layer delamination of the materials from the flexible substrate. This is especially true when scribing with pulsed lasers.

Embodiments of the disclosure thus may take advantage of a scribing method, preferably using a laser, where heat generated by the scribing process locally transforms material layers surrounding the scribed cavities so as to cause increased conductivity, thereby enabling the design and production of cost-efficient series-interconnected optoelectronic components and subsequent monolithic optoelectronic module apparatuses.

One embodiment of the present invention is created by providing thin-film photovoltaic material, such as a CIGS cell or a module where the back-contact layer may have been patterned with cells, and scribing line segment via holes into the thin-film material so as to form at least one conductive monolithic interconnect between a portion of the back-contact layer and a portion of the front-contact layer.

Embodiments of the disclosure may thus provide a method of fabricating monolithically-integrated optoelectronic modules that includes a method of forming at least one thin-film CIGS device, comprising forming at least one line segment via holes in a region of said thin-film CIGS devices, said devices comprising at least one front-contact layer, one semiconductive optoelectronically active layer, one back-contact layer, and one substrate; and wherein at least one line segment via hole is formed by drilling by at least one laser and passes through at least one portion of at least one front-contact layer and at least one semiconductive optoelectronically active layer; and wherein drilling by at least one laser causes forming at least one CIGS-type wall of electrically conductive permanently metalized, copper-rich CIGS-type alloy at the level of the active layer lining the inner surface of said at least one line segment via hole, said CIGS-type alloy resulting from a permanent change in the chemical composition of the CIGS semiconductive optoelectronically active layer where the hole is drilled, forming of an electrically conductive path between at least one portion of at least one front-contact layer and at least one portion of at least one back-contact layer, forming of a front-contact bump-shaped raised portion at the surface of the front-contact layer along the edge of the inner surface of said line segment via hole, and forming a raised portion of the back-contact layer raised towards the front-contact layer at the base of the inner surface of said line segment via hole.

In said method, forming of at least one via hole may cause removal of a portion of back-contact layer within the via hole, thereby exposing a portion of substrate. Furthermore, forming of at least one via hole may cause removal of a portion of back-contact layer within the via hole, thereby exposing a portion of substrate, and wherein raising of a portion of the back-contact layer causes forming of at least one gutter-shaped curl-up of at least a portion of the back-contact layer at the periphery of the exposed portion of substrate. More precisely, forming of at least one via hole may comprise forming at least one gutter-shaped curl-up-only of at least a first portion and forming at least one gutter-shaped curl-up-and-back of at least a second portion of the back-contact layer at the periphery of the exposed portion of substrate. In said method, the substrate may be polyimide. In greater detail, drilling of at least one via hole may be with at least one continuous wave laser. Furthermore, forming of at least one via hole may be with at least one laser forming, on said thin-film CIGS device, a laser spot having an asymmetrical laser spot diagram. More precisely, the laser power measured at the level of the substrate for drilling of at least one via hole may comprise a progressive increase in laser power over a portion of the time where laser power is delivered to the via hole. Furthermore, drilling of at least one via hole by at least one laser may comprise moving at least one laser spot at the surface of the thin-film CIGS device wherein at the extremity corresponding to the beginning of drilling of said via hole there is a progressive increase in laser power over a power increase distance portion of the distance where laser power is delivered to the via hole. Drilling of at least one via hole may form, upon microscopic inspection when seen from the light exposed side of the device, an inner-surface of CIGS-type alloy describing an oval pattern that has a radius of curvature that is smaller at the extremity corresponding to the beginning of drilling of said via hole line segment than at the end extremity. In practice, drilling of at least one via hole by at least one laser may comprise moving at least one laser spot of at least one continuous wave laser such that the laser energy delivered to at least one portion of the via hole is comprised between 1 J/m and 8 J/m. More specifically, drilling of at least one via hole by at least one laser may comprise an interval of time where laser-provided fluence is in the range from $5\times10^8$ J/m² to $41\times10^8$ J/m². More precisely, drilling of at least one via hole by at least one laser may comprise an interval of time where laser-provided steady state fluence is in the range from $7.5\times10^8$ J/m² to $11\times10^8$ J/m². Also, drilling of at least one via hole may be with at least one picosecond pulse laser. For greater manufacturing throughput, drilling of at least one via hole may be done at the same time as laser scribing an adjacent ablating line into the front-contact layer. In a broader way, forming said thin-film CIGS device may comprise forming at least one dashed line comprising a plurality of said line segment via holes in a region of said thin-film CIGS device.

An embodiment of the disclosure also pertains to a thin-film CIGS device, that may be obtainable by the described method, comprising at least one line segment via hole in a region of said thin-film CIGS device, said device comprising at least one front-contact layer, one semiconductive optoelectronically active layer, one back-contact layer, and one substrate; and wherein at least one via hole passes through at least one portion of at least one front-contact layer and at least one semiconductive optoelectronically active layer, comprises at least one CIGS-type wall formed of electrically conductive permanently metalized copper-rich CIGS-type alloy at the level of the active layer lining the inner surface of said at least one via hole, said CIGS-type alloy resulting from a permanent change in the chemical composition of the CIGS semi-conductive optoelectronically active layer caused when the hole was drilled, comprises an electrically conductive path between at least one portion of at least one front-contact layer and at least one portion of at least one back-contact layer, comprises a front-contact bump-shaped raised portion at the surface of the front-contact layer along the edge of the inner surface of said line segment via hole, and comprises a raised portion of the back-contact layer raised towards the front-contact layer.

In said device, a portion of substrate may be exposed within the via hole. Furthermore, a portion of substrate may be exposed within the via hole and at least a raised portion of back-contact layer may form at least one gutter-shaped curl-up at the periphery of the exposed portion of substrate. Still further, at least one via hole may comprise at least one gutter-shaped curl-up-only of at least a first portion and at least one gutter-shaped curl-up-and-back of at least a second portion of the back-contact layer at the periphery of the exposed portion of substrate. More specifically, the substrate may be polyimide. In greater detail, upon microscopic inspection from the light exposed side of the device, the shape of the inner surface of the CIGS-type wall may have a radius of curvature that is smaller at the extremity of the via hole line segment identifiable as corresponding to where drilling of said via hole began than at the end extremity. Furthermore, at least one line segment via hole may comprise at least one raised portion of conductive CIGS-type alloy that at least covers a portion of the surface of the front-contact layer. In a broader way, said device may comprise at least one dashed line in a region of said thin-film CIGS device, said dashed line comprising a plurality of said line segment via holes.

Embodiments of the disclosure may also comprise a monolithically-integrated optoelectronic module that comprises non-shadowing busbars, various sizes and number of current-collecting grids, encapsulating material, and variations in the depth and/or shape and/or location and/or number of vias.

ADVANTAGES

Embodiments of the disclosure provided herein may advantageously solve several problems in the field of manufacturing of thin-film photovoltaic devices, and more specifically roll-to-roll manufacturing of photovoltaic devices or modules of interconnected optoelectronic components, such as flexible photovoltaic modules. For thin-film flexible photovoltaic devices manufactured using one or more of the embodiments or methods described herein, the advantages obtainable over conventional devices may include:

Enlarged laser scribing process window,
Greater repeatability of laser scribing process,
Higher photovoltaic conversion efficiency,
Greater strength of monolithic interconnects,
Greater manufacturing yield,
Greater range of designs,
Greater photovoltaic module reliability,
Lower manufacturing costs.

The listed advantages provided above should not be considered as necessary for use with one or more of the embodiments described herein, and are not intended to be limiting as to the scope of the invention described herein.

One of the benefits of the embodiments described herein includes the formation of line segment via holes, which may be especially useful for monolithic interconnects in thin-film devices as well as to provide connections to busbars and even to non-shadowing busbars.

DETAILED DESCRIPTION OF SPECIFIC EMBODIMENTS

Figure 1A:
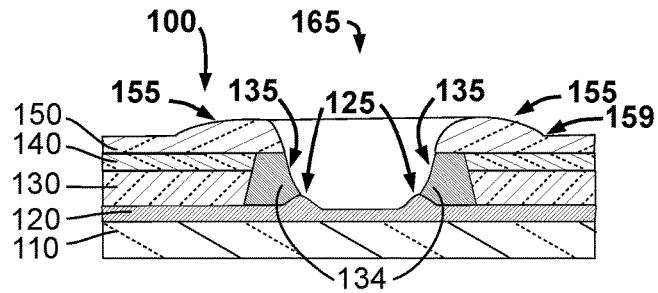
FIGS. 1A-1B show cross-sectional views of embodiments of line segment via holes in thin-film CIGS devices with raised CIGS-type via hole wall surfaces.
Figure 1B:
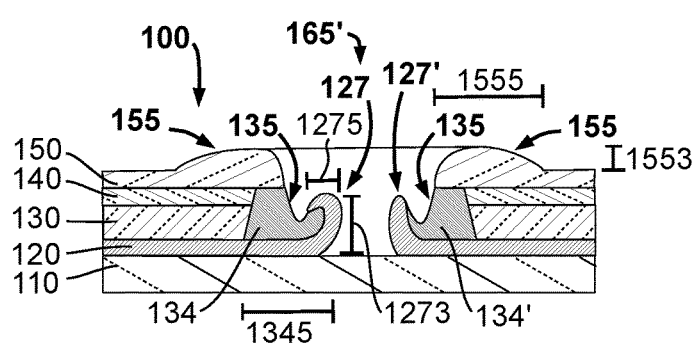

FIGS. 1A to 1B depict two exemplary embodiments of the disclosure provided herein, each figure being representative of a technical variation of how the method of forming line segment via holes is performed for forming monolithically-integrated optoelectronic modules. Someone skilled in the art will appreciate that the scales of the various components represented in the figures have been adjusted to improve clarity, and thus are not intended to be limiting as to the scope of the invention provided herein. Furthermore, the number and areas of components in the figures are schematically shown and thus may be further adjusted or adapted to form an industrial production worthy monolithically-integrated optoelectronic module. Most features described for FIGS. 1A and 1B also apply to FIGS. 6B and 6C, the differences are that the embodiments of FIGS. 6B and 6C comprise at least one raised portion of CIGS-type alloy 155' that at least partially covers the surface of front-contact layer 150 and that the bump of front-contact raised portion 155 of FIGS. 1A and 1B is numbered 157 in FIGS. 6B and 6C.

FIG. 1A shows a cross-section of a portion of thin-film device 100 where a line segment via hole 165 has been scribed, preferably using a laser. The thin-film device comprises at least one electrically insulating substrate 110, at least one electrically conductive back-contact layer 120, at least one absorber layer 130, optionally at least one buffer layer 140, and at least one electrically conductive front-contact layer 150.

The electrically insulating substrate 110 may be rigid or flexible and be of a variety of materials or coated materials such as glass, coated metal, plastic-coated metal, plastic, coated plastic, such as metal-coated plastic, or flexible glass. A preferred flexible substrate material is polyimide as it is very flexible, sustains temperatures required to manufacture high efficiency optoelectronic devices, requires less processing than coated metal substrates, and exhibits thermal expansion coefficients that are compatible with those of photovoltaic material layers deposited upon it. Industrially available polyimide substrates are ordinarily available in thicknesses ranging from 7 µm to 150 µm, can sustain temperatures of about 400-600° C., and permit roll-to-roll production.

At least one electrically conductive back-contact layer 120 coats substrate 110. Back-contact layer 120 preferably has a high optical reflectance and is commonly made of molybdenum (Mo) although several other thin-film materials, such as metal chalcogenides, molybdenum chalcogenides, molybdenum selenides (such as $MoSe_2$), sodium (Na)-doped Mo, potassium (K)-doped Mo, Na- and K-doped Mo, transition metal chalcogenides, tin-doped indium oxide (ITO), doped or non-doped indium oxides, doped or non-doped zinc oxides, zirconium nitrides, tin oxides, titanium nitrides, titanium (Ti), tungsten (W), tantalum (Ta), gold (Au), silver (Ag), copper (Cu), and niobium (Nb) may also be used or included advantageously.

At least one absorber layer 130 coats electrically conductive layer 120. Absorber layer 130 is typically made of an ABC material, wherein A represents elements in group 11 of the periodic table of chemical elements as defined by the International Union of Pure and Applied Chemistry including copper (Cu) or silver (Ag), B represents elements in group 13 of the periodic table including indium (In), gallium (Ga), or aluminum (Al), and C represents elements in group 16 of the periodic table including sulfur (S), selenium (Se) or tellurium (Te). An example of an ABC material, as an $ABC_2$ material, is the $Cu(In,Ga)Se_2$ semiconductor also known as CIGS.

Optionally, at least one semiconductive buffer layer 140 coats absorber layer 130. Said buffer layer ordinarily has an energy bandgap higher than 1.5 eV and is for example made of CdS, Cd(S,OH), CdZnS, indium sulfides, zinc sulfides, gallium selenides, indium selenides, compounds of (indium, gallium)-sulfur, compounds of (indium, gallium)-selenium, tin oxides, zinc oxides, Zn(Mg,0)S, Zn(0,S) material, or variations thereof.

At least one transparent conductive layer 150 coats buffer layer 140. Said transparent conductive layer, also known as the front-contact, ordinarily comprises a transparent conductive oxide (TCO) layer, for example made of doped or non-doped variations of materials such as indium oxides, tin oxides, or zinc oxides.

Line segment via hole 165 is a thin-film microstructure ordinarily formed after depositing front-contact layer 150. Line segment via hole 165 is preferably scribed using at least one laser, preferably at least one continuous wave laser, so that local heat caused by scribing causes the CIGS material at the level of the CIGS absorber layer 130 lining the inner-surface of said line segment via hole 165 to permanently become electrically conductive, thereby forming CIGS-type wall 134. The material of CIGS-type wall 134 results from a local, heat-induced transformation of the CIGS material of absorber layer 130. The heat-induced transformation can be described as a partial melt and partial vaporization of the chemical components of the CIGS material, thereby resulting in CIGS-type wall 134 being formed of a copper-rich CIGS-type alloy.

A person skilled in the art may observe and quantify the thin-film microstructures and the distribution of materials using scanning electron microscopy, energy-dispersive X-ray spectroscopy (EDS), and image-processing software. Energy-dispersive X-ray spectroscopy (EDS) characterization of the copper-rich CIGS-type alloy suggests it comprises at least copper-selenide and copper.

Said CIGS-type alloy therefore forms a metalized CIGS-type wall 134 of line segment via hole 165. The metalized CIGS-type wall 134 extends within line segment via hole 165 in the direction of thin-film thickness from the back-contact layer 120 to at least front-contact layer 150. The metalized CIGS-type wall 134 therefore provides an electrically conductive path between back-contact layer 120 and front-contact layer 150. The resistivity of CIGS-type wall 134 is ordinarily in a range between that of copper, that has a resistivity of about $1.68 \times 10^8$ Ω.m, and about $2 \times 10^2$ Ω.m, with satisfactory values within a range of about $1.9 \times 10^3$ Ω.m to $2.1 \times 10^3$ Ω.m.

Therefore, by controlling the energy delivered during a laser scribing process, a segmented via hole 165 can be desirably formed. Local heat generated by the scribing process, preferably using at least one laser, preferably at least one continuous wave laser, also causes forming of at least one raised portion 125 of back-contact layer 120 raising towards the front-contact layer 150. The raised portion 125 may provide improved mechanical and electrical contact with CIGS-type wall 134.

Furthermore, local heat generated by the scribing process may optionally cause forming of a front-contact raised portion 155 at the surface of front-contact layer 150. The front-contact raised portion ordinarily resembles a bump along most of the via hole's periphery. The bump's shape ordinarily blends with the inner surface 135 of the via hole's CIGS-type wall 134 and, towards the outer side, may either blend progressively or form an obtuse angle joint 159 with the front-contact layer. The cross-section of the outer side of the bump may for example be modeled by an optionally truncated bump function: $y=\exp(-1/(1-x^2))$ for $|x|<1$ (or $|x|<<1$ if truncated), $y=0$ otherwise. Said front-contact raised portion 155 may comprise indium diffused from the underlying absorber layer 130. Said indium may be present as a result of both heat radiating and diffusing from the location where laser energy is applied and from heat radiating from a hot plate effect caused by the presence of the underlying back-contact layer 120 during the laser scribing process, therefore causing indium to diffuse from the absorber layer 130 into the front-contact layer 150.

FIG. 1B shows a cross-section of a variation of FIG. 1A, where a portion of substrate 110 is exposed within the via hole 165' and at least one raised portion of back-contact layer 120 forms a gutter-shaped curl-up 127, 127' at the periphery 117 of the exposed portion of the substrate. Exposing substrate 110 and forming gutter-shaped curl-up 127, 127' of the back-contact layer 120 may confer larger laser scribing manufacturing window, greater production yield, and mechanical resistance than the embodiment presented in FIG. 1A. FIG. 1B presents two variations of CIGS-type walls 134, 134' and corresponding raised portions of the gutter-shaped curl-ups 127, 127' of back-contact layer 120. Variation in CIGS-type wall 134 and back-contact raised portion of the gutter-shaped curl-ups 127 is characterized in that its raised portion curls up and curls backwards, thereby forming a curl-up-and-back 127 type of curl-up, thereby surrounding and possibly blending locally with material of inner-surface 134 to form a non-homogeneous compound comprising copper, copper selenide, and molybdenum. Variation in inner-surface 134' and back-contact raised portion of the gutter-shaped curl-up 127' is characterized in that raised portion curls up but does not curl backwards, thereby forming a curl-up-only 127' type of curl-up, and comprises less blending of materials than in the curl-up-and-back 127.

The two CIGS-type wall variations 134, 134' and raised portions of the gutter-shaped curl-up 127, 127' may be present in separate via holes or in the same via hole. For example, at least one portion of one long side of a via hole 165' may be representative of variations 134, 127 while at least one portion of the other long side may be representative of variations 134', 127'. Compared to FIG. 1A, forming of the raised portion of the gutter-shaped curl-up 127, 127' of the back-contact layer 120 may in some embodiments result in a comparatively higher raising of inner-surface 134, 134' and also optionally higher raising of front-contact raised portion 155.

Gutter-shaped curl-ups 127, 127' may be advantageous for increased via hole conductivity and strength against thin-film layer delamination. In effect, gutter-shaped curl-ups 127, 127' form welds, ordinarily comprising a non-homogeneous distribution of molybdenum, copper, and possibly copper-selenide, which locally reinforce the binding of thin-film layers to each other, especially the binding of the nearby non-molten CIGS semiconductive optoelectronically active layer to the back-contact molybdenum layer. Via holes or monolithically interconnecting grooves manufactured according to prior art, especially those manufactured using pulsed lasers instead of continuous wave lasers, may exhibit less mechanical strength, ordinarily recognizable by delaminations, flaking, and cracks in the thin-film layers of the photovoltaic devices.

Forming of variations 134, 127 and 134', 127' may be advantageous to design local adaptations of the conductivity of a via hole segment or, if the via hole segment is long enough, local adaptations of the conductivity along the length of a via hole segment by varying the height 1273 and width 1275 of the curl-up, the width of copper-rich CIGS-type alloy 1345, and the amount of indium diffused into the bump-shaped raised portion 155 of the front-contact 150. For example, it may be advantageous in one embodiment to have one side of a via hole segment, such as the side that is closest to most of a cell's light exposed front-contact area, to be more conductive than the other side, such as the side that is closest to the front-contact layer grooves 151 (shown in FIG. 2 and FIG. 3). It may also be advantageous to tailor the conductivity of the sides of a via segment so as to present a compatibility with variations in local conductivity at a cell's surface, such as variations afforded by the presence, proximity, or adjoining of front-contact conductive grid components. An embodiment may for example comprise via hole segments of various lengths, possibly via hole segments describing curves, where any one of the sides of any one of the via segments comprises a combination of variations 134, 127 and 134', 127'.

A method to manufacture at least one via hole line segment that comprises at least one of said variations may comprise using a laser spot where, when considering the laser's spot diagram at the surface of the device to be laser scribed, the region of highest laser light intensity of the laser spot is not located symmetrically with respect to the center of the laser's spot diagram. Asymmetry of the laser's spot diagram may for example be obtained by adjustments of a laser beam shaper or a laser beam expander positioned within the laser beam's optical path. By selecting or controlling the position of the region of highest laser intensity within the laser spot, a person skilled in the art may select or control the formation of curl-up variations 127 and 127'. A person skilled in the art may also desirably vary the position of the region of highest laser intensity within the laser spot so as to vary the forming of line segment via holes, such as for forming a plurality of gutter-shaped curl-ups of varied characteristics within at least one line segment via hole.

Figure 2:
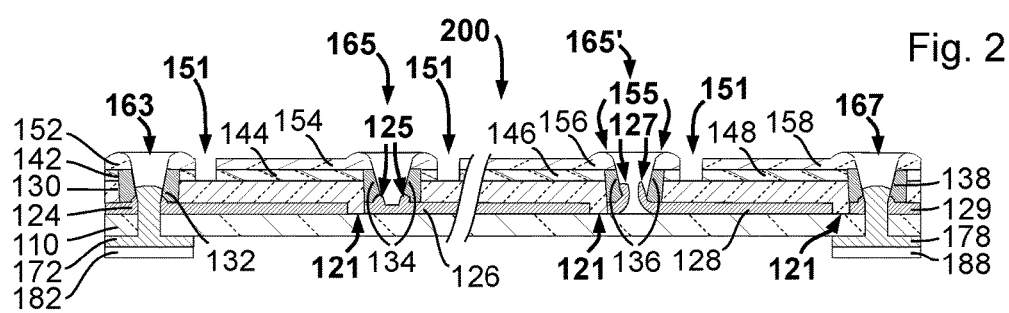
FIG. 2 shows a cross-sectional view of a thin-film CIGS module comprising a plurality of line segment via holes.

FIG. 2 shows a cross-section of a thin-film CIGS photovoltaic module 200 comprising a plurality of line segment via holes 163, 165, 165', 167. Line segment via holes 165 enable series, monolithic interconnects between adjacent cells of the photovoltaic module. Line segment via holes 163, 167 enable electrical interconnection of front-contact or back-contact layer components to an underlying busbar 182, 188. At least one line segment via hole 163, 165, 165', 167, comprises a copper-rich CIGS-type wall 132, 134, 136, 138 resulting from heat-induced transformation of the CIGS material of the absorber layer, as described for at least one of FIGS. 1A-1B, and at least one raised portion 125, 127, of back-contact layer. Any one of said via holes 163, 165, 165', 167 may optionally comprise at least one front-contact raised portion 155 formed over a front-contact layer component 156 as also shown in FIGS. 1A-1B. Any one via hole 163, 165, 165', 167 may optionally comprise at least one back-contact layer component 128 formed with a gutter-shaped curl-up 127, 127' as also shown in FIG. 1B.

Similarly to the description of FIG. 1A, photovoltaic module 200 comprises at least one electrically insulating substrate 110, at least one electrically conductive back-contact layer, here represented by back-contact layer components 124, 126, 128, 129, at least one absorber layer 130, optionally at least one buffer layer, here represented by buffer layer components 142, 144, 146, 148, and at least one electrically conductive front-contact layer, here represented by front-contact layer components 152, 154, 156, 158. Back-contact layer grooves 121 that form the electrically separate back-contact layer components are ordinarily laser scribed prior to deposition of the absorber layer. Front-contact layer grooves 151 that at least form the electrically separate front-contact layer components are ordinarily laser scribed, preferably with a pulsed laser, more preferably with a picosecond pulsed laser, and said grooves may extend in depth to the surface of said back-contact layer components.

Line segment via holes 165 establish a monolithic interconnect between at least one first front-contact layer component 154, 156, and at least one second back-contact layer component 126, 128. Said via holes may be scribed before, after, or at the same time as scribing of the front-contact layer grooves 151. Furthermore, the same laser source may be used to scribe via holes 165 and front-contact layer grooves 151.

Line segment via holes 163, 167 enable electrical contact to at least one busbar 182, 188. Via holes 163, 167 may be scribed deeper than via holes 165, 165', so as to ablate a portion of substrate 110. A conductive paste 172, 178, may be used to establish an electrical path between thin-film layers of via holes 163, 167, and busbars 182, 188, respectively. Said conductive paste may also be used as a filler in at least one via hole 163, 165, 165', 167 to augment the conductivity of the connection provided by the inner-surface 132, 134, 136, 138 within said via hole 163, 165, 165', 167.

Figure 3:
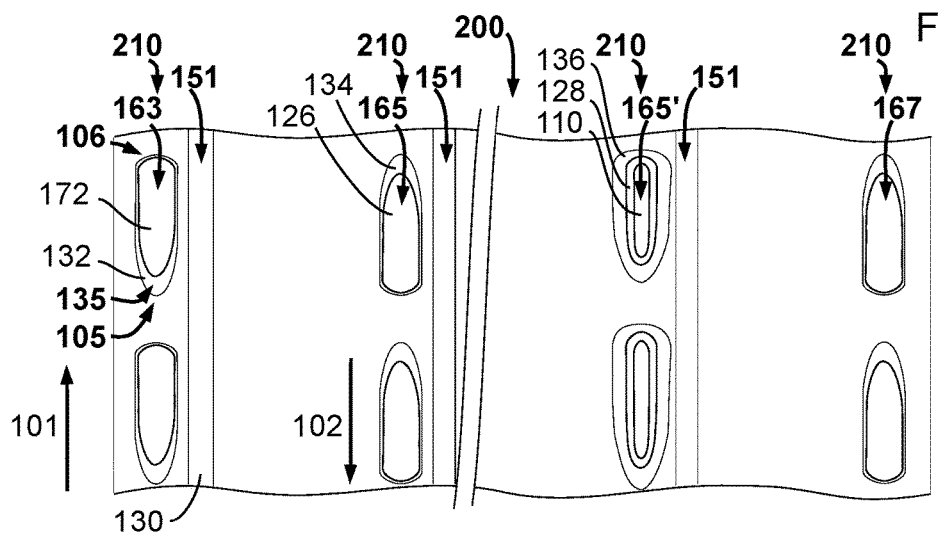
FIG. 3 shows a top view, or view of the light exposed side, of the thin-film CIGS module comprising a plurality of line segment via holes shown in FIG. 2.

FIG. 3 shows a schematic top or plan view, or view of the light exposed side, of the thin-film CIGS module 200 comprising a plurality of line segment via holes 163, 165, 165', 167, with alternate orientations, the cross-section of which is shown in FIG. 2. Lines 210 of line segment via holes 163, 165' have been scribed in direction 101 and line segment via holes 165, 167 have been scribed in the reverse direction 102. The direction of scribing is recognizable in that the extremity corresponding to the beginning of drilling 105 of a line segment via hole has a radius of curvature that is smaller than at the end extremity 106. The length and shape of the extremity corresponding to the beginning of drilling 105 is the result of laser motion and progressive laser power increase. Progressive laser power increase is preferred to produce the conductive CIGS-type alloy while minimizing the risk for unwanted cracks and delaminations that are frequently produced when using pulsed lasers. For some laser scribing parameters and thin-film CIGS devices, the direction of scribing may also be recognized in that the extremity corresponding to the beginning of drilling 105 has a more elongated inner surface 135 of CIGS-type wall 132, 134, 136, 138 than at the extremity corresponding to the end of drilling 106. Line segment via holes 163, 165, 165', 167 may also be characterized in that a portion of the via hole length at the extremity corresponding to the beginning of drilling 105 is narrower than the average width of the via hole, excluding the portion at end extremity 106. Line segment via hole 165' is also illustrated with a top view of the gutter-shaped curl-up 127 or 127' of back-contact layer component 128 and the visible portion of substrate 110. Front-contact layer grooves 151 reveal portions of absorber layer 130. Front-contact layer grooves 151 that separate front-contact components can be manufactured at the same production step as that used for manufacturing line segment via holes, thereby advantageously reducing production complexity, time, costs, and number of tools.

Although line segment via holes may be scribed in any direction, it may be advantageous for increased manufacturing speed to scribe a first line of line segment via holes in a first direction 101 and then a second line of line segment via holes, such as an adjacent line, in a second and opposite direction 102. Furthermore, line segment via holes may be of different variations, as presented in the description for FIGS. 1A-1B, FIG. 2, and FIG. 3, different dimensions, such as length and/or width, and have different separations whether between line segment via holes on a given line or between lines of line segment via holes.

Figure 4A:
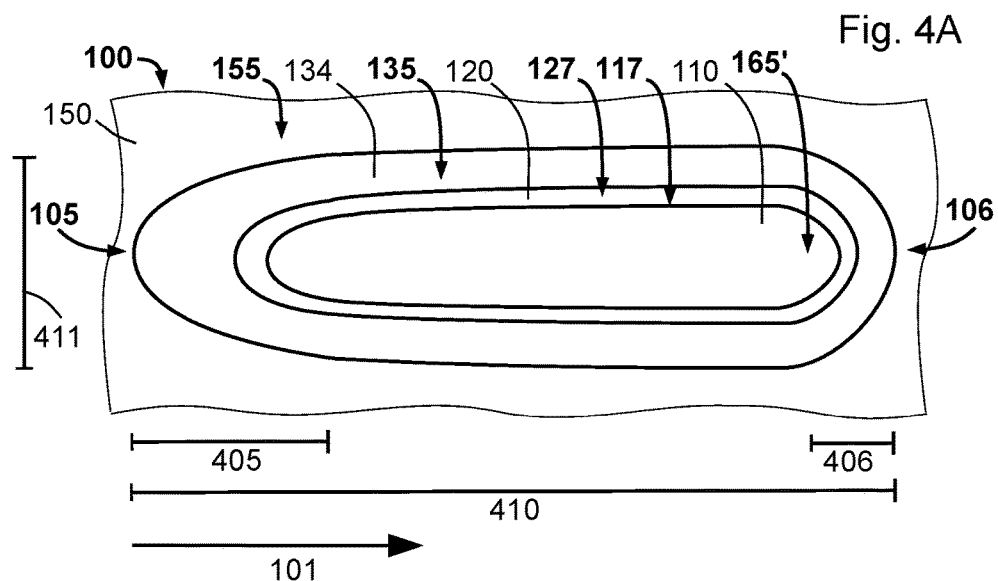
FIGS. 4A-4B show a top view, or view of the light-exposed side, of a line segment via hole and a graph of the corresponding laser power used to laser scribe the line segment via hole.
Figure 4B:
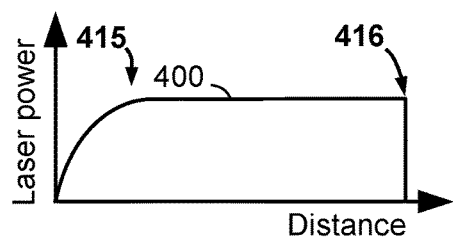

FIG. 4A shows a top view, or view of the light exposed side, of an embodiment of a line segment via hole 165' and FIG. 4B is a graph of the corresponding laser power 400 used to laser scribe the line segment via hole. Line segment via hole 165' is laser scribed into thin-film device 100 in direction 101. In FIG. 4A the laser power used forms a via hole comprising a raised, gutter-shaped curl-up 127 of the back-contact layer 120 at the periphery 117 of the exposed portion of substrate. Curl-up 127 may comprise portions of curl-up variations curl-up-and-back 127 or curl-up-only 127' shown in FIG. 1B. The underlying substrate 110 is also visible as a result of the partial ablation of the back-contact layer 120. FIG. 4A also illustrates a CIGS-type wall 134 capped by at least one front-contact raised portion 155 covering a portion of front-contact layer 150. Also visible in FIG. 4A is, within a laser power increase distance portion 405, an inner surface 135 of CIGS-type wall 134 that is more elongated than the rest of the via hole's periphery. It is within said laser power increase distance portion 405 that follows the extremity corresponding to the beginning of drilling 105 that the portion of via hole is ordinarily narrower than the average width of the via hole, excluding end length 406 leading to end extremity 106.

The graph in FIG. 4B shows how the plot 400 of laser power versus distance ordinarily comprises a laser power increase portion 415. Said laser power increase portion starts from a power level that is within no power and a power level that does not form any scribing trace and ends with laser power at a level that enables forming any via hole segment similar to those presented in the description for FIGS. 1A, 1B, 6B and 6C. The increase in laser power is ordinarily controlled via the laser's controller but may also be obtained by means of mechanical or optoelectronic shutters. The increase in laser power as a function of distance is ordinarily progressive and ordinarily shaped as a ramp or a step response of a damped first or second order system model. The laser spot ordinarily moves during said laser power increase distance portion by a distance 405. However, laser power may optionally be set to increase without motion of the laser spot. The laser power increase distance portion is ordinarily followed by a portion of constant power where the laser spot may move over any length and scribe or trace any pattern into the thin-film photovoltaic device 100, 200. Said pattern ordinarily comprises at least one line segment but may also comprise turns, a connected sequence of segments, or describe curves. Scribing of the via hole ends with a laser power decrease step 416 forming the end extremity 106 of the line segment via hole. Laser power is then reduced, ordinarily abruptly, to a level, ordinarily below ablation threshold power, that does not form any scribing of via hole, preferably any scribing trace.

To summarize, the laser power increase portion 415 forms the beginning of drilling extremity 105 whereas the laser power decrease step 416 forms the end extremity 106. The rate at which energy is supplied during laser power increase portion 415 is an important parameter to successfully form a via hole with highly conductive CIGS-type wall 134, 134' and gutter-shaped curl-up 127, 127'. Examples of some desirable laser scribing process parameters are discussed in more detail below. Too high a rate may result in layer delaminations, excessive layer ablation, and irregular via holes which may reduce photovoltaic efficiency of the overall device, contribute to flaking of thin-film layers, cause failure points, and shorten the device's lifetime. An abrupt laser power decrease step 416 will ordinarily enable forming of a successfully conductive end extremity 106. The abruptness of the laser power decrease is not a requirement but may be advantageous when the laser's output is controlled by an electronic controller or switch which may enforce a minimum duration, such as a simmer duration, between laser power outputs at a level that enables scribing.

Figure 5:
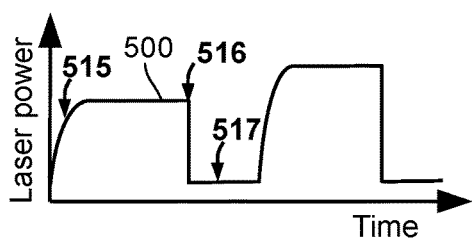
FIG. 5 is a graph of laser power versus time used to scribe a sequence of line segment via holes.

FIG. 5 is a graph of laser power versus time where two line segment via holes are scribed in different parts of, for example, a thin-film CIGS module 200. The graph's scale is different from that in FIG. 4B. The graph illustrates a line segment via hole scribing sequence to scribe at least one line segment via hole. As illustrated by laser power plot 500, the sequence to scribe at least one line segment via hole comprises at least one laser power increase time portion 515, where laser power increases progressively to initiate scribing of a first line segment via hole. The increase in laser power as a function of time is preferably progressive and ordinarily shaped as a ramp or a step response of a damped first or second order system model. The laser power increase time portion 515 may be used to form a beginning portion that is similar in shape to that within the laser power increase distance portion 405 that is illustrated in FIGS. 3 and 4A. Laser power then optionally reaches a steady state. The sequence then ordinarily comprises a laser power reduction portion 516, ordinarily with an abrupt laser power decrease step, ordinarily to a laser power level that is below ablation threshold power. This is then followed by a reduced power level portion 517, which is ordinarily maintained at a level that does not form a via hole, or preferably any scribing trace. The line segment via hole scribing sequence is then repeated for as many line segments as necessary. Due to the large processing window, the laser power level, laser scribing duration, laser power increase and decrease portion duration and profiles need not be the same from one line segment via hole to another, as illustrated in FIG. 5.

Although this is not needed to manufacture line segment via holes for thin-film photovoltaic devices, a person skilled in the art who may want to tune the manufacturing process will henceforth be able to manufacture large numbers of line segment via holes at high speed and proceed to measure the specific resistance of each via hole. The person skilled in the art may also prepare and cut out portions of via holes bearing specific characteristics such as curl-up variations curl-up-and-back 127 or curl-up-only 127', height 1273 and width 1275 of the curl-up, and in-layer extent 1345 of copper-rich CIGS-type alloy so as to measure the specific resistance of the via hole portion and subsequently select the most appropriate laser spot shape and position of the region of highest laser intensity within the laser spot. A satisfactory process yields an average value for resistivity of the CIGS-type wall at $3.2 \times O-3$ $\Omega \cdot m$, more preferably at $2 \times O-3$ $\Omega \cdot m$, with standard deviation of 0.06.

As an example, the laser power increase time portion 515 using a continuous wave laser delivering a 6 W and 50 μm diameter laser spot to the device's surface lasts preferably between 10 μs and 4 us for a laser scanning speed between 3 m/s and 5 m/s, and preferably between 50 μs and 7 μs for a laser scanning speed between 0.5 m/s and 3 m/s. The corresponding laser power increase rate measured at the device's surface is therefore in the range between about $1 \times 10^8$ W m/s−2 and $17 \times 10^8$ W m/s−2. For a preferred laser scanning speed of about 3.7 m/s the preferred laser power increase time portion 515 lasts about 7 μs with an increase in laser power shaped as a step response of a damped first or second order system model. A preferred laser power decrease step 416 is an abrupt decrease of laser power to a level below ablation threshold power.

The laser power increase distance portion 405, 415 is ordinarily at least 5 μm in length. The portion of steady state or laser constant power may be set for a measured power of, for example, about 7 W, at the surface of the device to be scribed and a laser scanning speed of, for example, about 3.7 m/s. In this case the laser power is measured at the surface of the device to be laser scribed using a laser power meter with thermopile sensor capable of measurements from 10 μW up to 30 kW. A person skilled in the art may choose a greater laser power, possibly in combination with a greater speed of the laser scribing spot. The steady state laser power is ordinarily set for a measured power in the range from 0.2 W to 20 W, preferably from 2 W to 10 W, more preferably from 5 W to 8 W. The laser's wavelength is ordinarily in the range from 532 nm to 1064 nm. The laser scribing spot diameter is ordinarily in the range from 5 μm and 1000 μm, preferably between 5 μm and 300 μm, more preferably between 30 μm and 50 μm.

A line segment via hole scribing sequence may preferably form line segment via holes that are, for example, about 200 μm in length with an about 50 μm separation between the end extremity of a first via hole and the beginning extremity of a second via hole. Ordinarily, via hole length 410 may be in the range of 50 μm to 0.1 m, preferably in the range of 50 μm to 1000 μm, more preferably in the range of 180 μm to 220 μm, and separation in the range of 10 μm to 1000 μm, preferably in the range of 10 μm to 100 μm, more preferably in the range of 40 μm to 60 μm. A person skilled in the art may prefer to specify a scribe-to-no-scribe length ratio which may be in the range of 1:1 to 100:1, preferably 4:1. Line segment width 411, comprising the inner surface 135 of CIGS-type wall 134 and front-contact raised portion 155 covering a portion of front-contact layer 150, is ordinarily in the range of 10 μm to 100 μm, preferably in the range of 25 μm to 75 μm, more preferably in the range of 45 μm to 55 μm, for example at about 50 μm. Referring to FIG. 1B, the bump of the front-contact raised portion 155 at the surface of front-contact layer 150 has a cross-section width 1555 measured from front-contact edge near the inner surface of the CIGS-type wall to the outer blend or obtuse joint where it meets with the front-contact layer is ordinarily in the range of 3 μm to 25 μm, preferably in the range of 10 μm to 15 μm, for example at about 12 μm. The thickness 1553 of the front-contact raised portion above the front-contact layer's flat surface is in the range from 0.5 μm to 6 μm, preferably in the range of 1 μm to 3 μm, more preferably in the range 1.5 μm to 2.5 μm, for example at about 2 μm. The height 1273 of the back-contact layer gutter-shaped curl-up 127, 127', measured from the surface of substrate 110, is ordinarily in the range of 0.5 μm to 10 μm, preferably in the range of 0.5 μm to 5 μm, more preferably in the range of 2 μm to 4 μm, for example at about 3 μm.

Laser scanning speed is ordinarily in the range of 0.1 m/s to 200 m/s, preferably in the range of 0.5 m/s to 100 m/s, more preferably in the range from 0.5 m/s to 6 m/s. The energy delivered by drilling at steady state laser power ordinarily ranges from 1 J/m to 8 J/m, preferably from 1.5 J/m to 2.2 J/m. The steady state laser fluence is ordinarily in the range from $5 \times 10^8$ J/m$^2$ to $41 \times 10^8$ J/m$^2$, preferably from $7.5 \times 10^8$ J/m$^2$ to $11 \times 10^8$ J/m$^2$. Although line segment via holes are preferably scribed using a continuous wave laser, a person skilled in the art may use a pulsed laser such as a picosecond laser.

The composition of laser-scribed microstructures may be analyzed using an X-ray diffraction (XRD) analysis system. The presence of back-contact layer gutter-shaped curl-ups is characterized by at least one peak in counts in the range between 58.5 26° and 59.5 26°, preferably at 58.7 26°, more preferably at 58.66 26° corresponding to the presence of Mo with a (220) Miller index orientation. Said peak in counts is greater by at least 5% than the number of counts for thin-film CIGS devices that do not comprise vias or scribings manufactured according to embodiments of the present invention. Mo thin-film that is not curled-up ordinarily has a (111) Miller index orientation. The gutter-shaped curl-up may blend or form an alloy with molten CIGS, thereby comprising copper and especially copper-selenide with non-uniform concentrations within the curl-up.

Figure 6A:
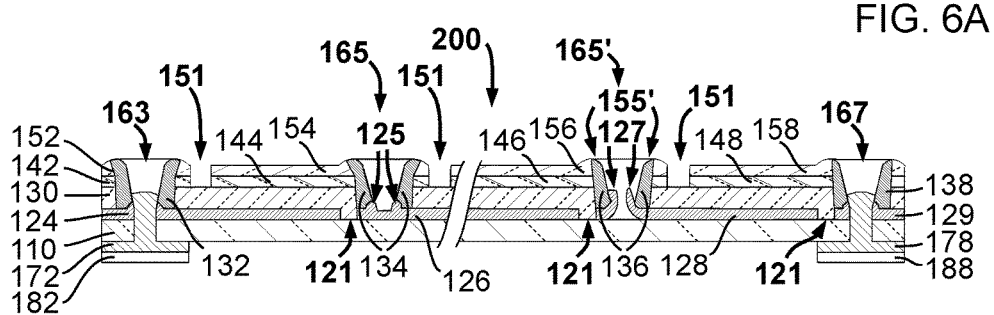
FIG. 6A-6E present a variation of FIGS. 2, 1A, 1B, and 4A, respectively, wherein raised CIGS-type via hole wall surfaces are more extensive and form over the front-contact layer.
Figure 6B:
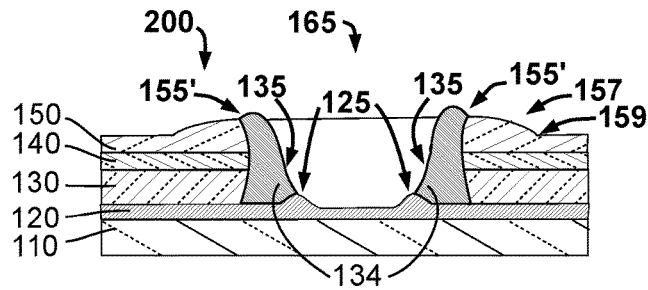
Figure 6C:
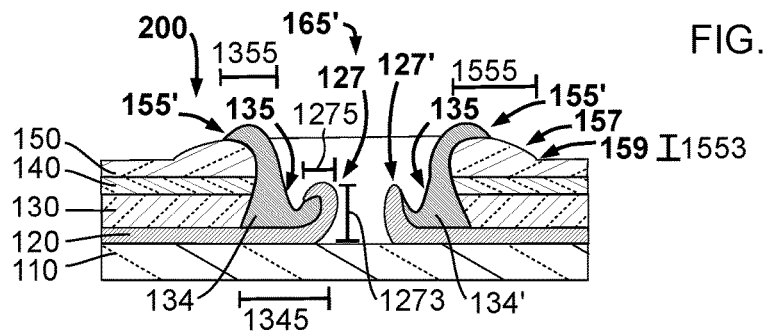

FIG. 6A is a variation of FIG. 2 and shows a cross-section of a thin-film CIGS photovoltaic module 200 comprising a plurality of line segment via holes 163, 165, 165', 167. Line segment via holes 165 enable series, monolithic interconnects between adjacent cells of the photovoltaic module. Line segment via holes 163, 167 enable electrical interconnection of front-contact or back-contact layer components to an underlying busbar 182, 188. At least one line segment via hole 163, 165, 165', 167, comprises a copper-rich CIGS-type wall 132, 134, 136, 138 resulting from heat-induced transformation of the CIGS material of the absorber layer, as described for at least one of FIGS. 6B-6C, and at least one raised portion 125, 127, of back-contact layer. Any one of said via holes 163, 165, 165', 167 may optionally comprise at least one raised portion of CIGS-type alloy 155' formed over a front-contact layer component 156 as also shown in FIGS. 6B-6C. Any one via hole 163, 165, 165', 167 may optionally comprise at least one back-contact layer component 128 formed with a gutter-shaped curl-up 127, 127', as also shown in FIG. 1B or 6C. In other respects, FIG. 6A corresponds to the description given for FIG. 2. The difference between FIG. 6A and FIG. 2 is that FIG. 6A comprises a raised portion of CIGS-type alloy 155' formed over a front-contact layer component 156.

FIGS. 6B and 6C depict two exemplary embodiments of devices comprising at least one raised portion of CIGS-type alloy 155' that at least partially covers the surface of front-contact layer 150. The raised portion of CIGS-type alloy ordinarily causes a bump of front-contact raised portion 157 along most of the via hole's periphery. Said bump of front-contact raised portion 157 may blend with the raised portion of CIGS-type alloy 155' and, towards the outer side, may either blend progressively or form an obtuse angle joint 159 with the front-contact layer. The front-contact raised portion 157 of FIGS. 6B and 6C corresponds to the front-contact raised portion 155 of FIGS. 1A and 1B. In other respects, FIG. 6B corresponds to the description given for FIG. 1A.

FIG. 6C shows a cross-section of a variation of FIG. 6B, where a portion of substrate 110 is exposed within the via hole 165' and at least one raised portion of back-contact layer 120 forms a gutter-shaped curl-up 127, 127' at the periphery 117 of the exposed portion of the substrate. Exposing substrate 110 and forming gutter-shaped curl-up 127, 127' of the back-contact layer 120 may confer larger laser scribing manufacturing window, greater production yield, and mechanical resistance than the embodiment presented in FIG. 6B. FIG. 6C presents two variations of CIGS-type walls 134, 134' and corresponding raised portions of the gutter-shaped curl-ups 127, 127' of back-contact layer 120. Said variations are similar to those described for FIG. 1B, the difference being that forming of the raised portion of the gutter-shaped curl-up 127, 127' of the back-contact layer 120 may in some embodiments result in a comparatively higher raising of inner-surface 134, 134' as raised portions of CIGS-type alloy 155' and also raising of front-contact raised portion 157. In other respects, FIG. 6C corresponds to the description given for FIG. 1A.

Forming of variations 134, 127 and 134', 127' may be advantageous to design local adaptations of the conductivity of a via hole segment or, if the via hole segment is long enough, local adaptations of the conductivity along the length of a via hole segment by varying the height 1273 and width 1275 of the curl-up, the width of copper-rich CIGS-type alloy 1345, the width of the lip of conductive CIGS-type alloy 1355, and the amount of indium diffused into the bump-shaped raised portion 155 of the front-contact 150. For example, it may be advantageous in one embodiment to have one side of a via hole segment, such as the side that is closest to most of a cell's light exposed front-contact area, to be more conductive than the other side, such as the side that is closest to the front-contact layer grooves 151 (shown in FIGS. 2, 3 and 6A). It may also be advantageous to tailor the conductivity of the sides of a via segment so as to present a compatibility with variations in local conductivity at a cell's surface, such as variations afforded by the presence, proximity, or adjoining of front-contact conductive grid components. An embodiment may for example comprise via hole segments of various lengths, possibly via hole segments describing curves, where any one of the sides of any one of the via segments comprises a combination of variations 134, 127 and 134', 127'.

Figure 6D:
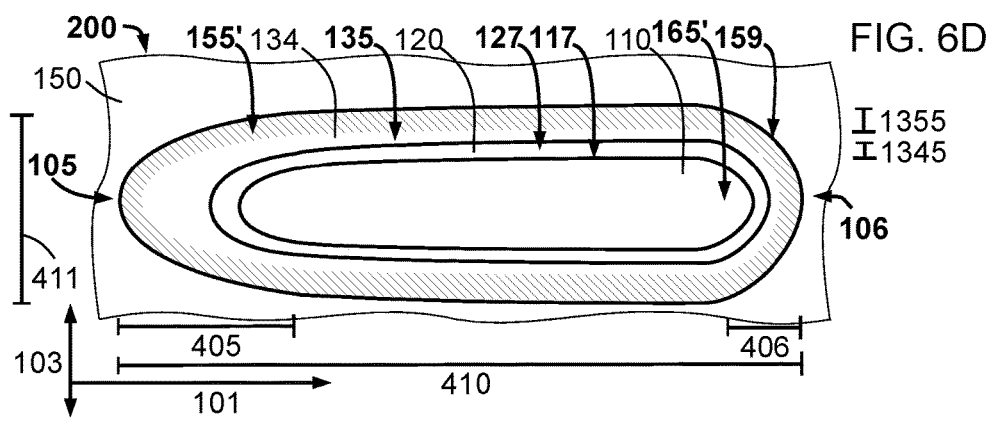

FIG. 6D shows a top view, or view of the light exposed side, of an embodiment of a line segment via hole 165' of FIG. 6C and FIG. 4B is a graph of the corresponding laser power 400 used to laser scribe the line segment via hole. Line segment via hole 165' is laser scribed into thin-film device 100 in direction 101. In FIG. 6D the laser power used forms a via hole comprising a raised, gutter-shaped curl-up 127 of the back-contact layer 120 at the periphery 117 of the exposed portion of substrate. Curl-up 127 may comprise portions of curl-up variations curl-up-and-back 127 or curl-up-only 127' shown in FIG. 6C. The underlying substrate 110 is also visible as a result of the partial ablation of the back-contact layer 120. FIG. 6D also illustrates a CIGS-type wall 155' covering a portion of front-contact layer 150. Also visible in FIG. 6D is, within a laser power increase distance portion 405, an inner surface 135 of CIGS-type wall 134 that is more elongated than the rest of the via hole's periphery. It is within said laser power increase distance portion 405 that follows the extremity corresponding to the beginning of drilling 105 that the portion of via hole is ordinarily narrower than the average width of the via hole, excluding end length 406 leading to end extremity 106. The contour of the obtuse angle joint 159 marks the outer limit of the line segment via hole. In other respects, FIG. 6D corresponds to the description given for FIGS. 1A and 4A.

Figure 6E:
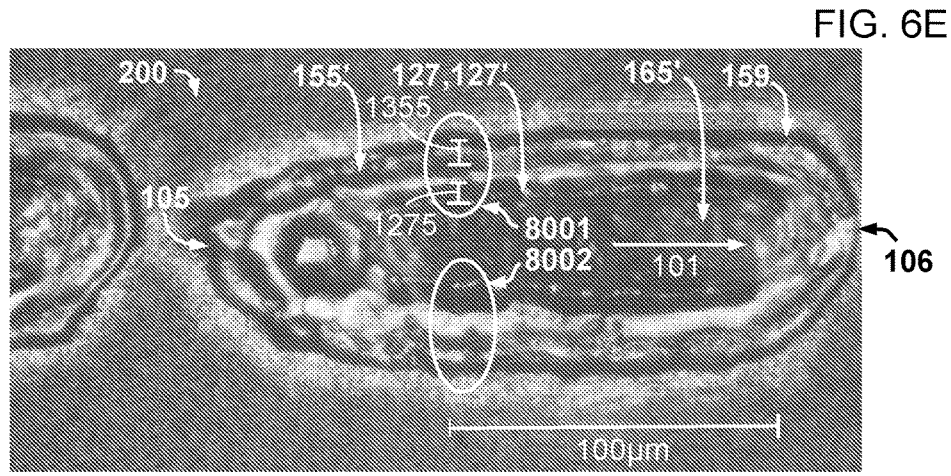

FIG. 6E presents an image of a thin-film device 200 comprising a line segment via hole 165, 165' acquired with a microscope with a camera. A portion of a second line segment via hole is also visible at the left of the image. Both line segment via holes are therefore part of a line of line segment via holes 210 as presented in FIG. 3. Highlighted in FIG. 6E are the locations of the extremity of beginning of drilling 105, the extremity of end of drilling 106, at least one location of a raised portion of CIGS-type alloy 155', and at least one location of a gutter-shaped curl-up 127, 127' of the back-contact layer component 128. The direction of scribing is therefore left to right. A person skilled in the art will notice that features of the line segment via hole 165' at the left of the scribing direction 101, highlighted in ellipse 8001, are finer those at the right of said scribing direction, highlighted in ellipse 8002. Line segment via hole 165' therefore presents an asymmetry with respect to the scribing direction 101. The contour of the obtuse angle joint 159 marks the outer limit of the line segment via hole.

A person skilled in the art may want to measure characteristics of a line segment via hole 165, 165'. For example, at least one of measures of the width of the lip 1355 of the raised portion of conductive CIGS-type alloy 155' and measures of the width of a curl-up 1275 of the back-contact layer 120, 124, 126, 128, 129 may provide indication that said line segment via hole is correctly formed. Said measures may for example provide a visual assessment that a satisfactory monolithic interconnect from a back-contact layer to a front-contact layer is achieved via conductive alloy resulting from a permanent change in the chemical composition of the semiconductive optoelectronically active layer where the line segment via hole is drilled. The width of the lip of conductive CIGS-type alloy 1355 is in the range from about 3 μm to about 15 μm, preferably from about 5 μm to about 20 μm, more preferably from about 8 μm to about 12 μm. The width of a curl-up 1275 of the back-contact layer is in the range from about 2 μm to about 15 μm, preferably from about 4 μm to about 10 μm, more preferably from about 6 μm to about 8 μm.

Another measure of interest to assess how well formed a line segment via hole 165, 165' is relates to, for example, the distance separating opposing features with respect to a line segment via hole's centerline according to the direction of scribing. Opposing features may for example be gutter-shaped curl-ups 127, 127', the inner surface 135 of CIGS-type walls, the obtuse angle joint 159 at the front-contact layer, or the width of the exposed portion of substrate 110 of the line segment via hole being considered. For example, the person skilled in the art may form an assessment of scribe quality by measuring said radius of curvatures at the beginning of drilling extremity 105 and at the end extremity 106, based on the visible contour formed by said features. For example, the radius of curvature based on the contour of the obtuse angle joint 159 is, at the extremity of beginning of drilling 105 in the range from about 7 μm to about 40 μm, preferably from about 12 μm to about 25 μm, more preferably from about 15 μm to about 20 μm. At the extremity of end of drilling 106, the radius of curvature based on the contour of the obtuse angle joint 159 is in the range from about 10 μm to about 50 μm, preferably from about 20 μm to about 35 μm, more preferably from about 23 μm to about 30 μm.

The invention claimed is:

1. A method of forming at least one thin-film Copper indium Gallium Selenide (CIGS) device, comprising:
   forming a line segment via hole in a region of a thin-film CIGS device, said device comprising:
   a front-contact layer;
   a semiconductive optoelectronically active layer;
   a back-contact layer;
   a substrate, wherein the line segment via hole:
      is formed by drilling with a continuous wave laser that applies a laser power to the line segment via hole that progressively increases from a first power level to a second power level during the drilling of the line segment via hole,
      passes through at least one portion of the front-contact layer and the semiconductive optoelectronically active layer, and
   wherein drilling by the laser causes:
      forming a CIGS-type wall of electrically conductive permanently metalized, copper-rich CIGS-type alloy lining an inner surface of the line segment via hole, said CIGS-type alloy resulting from a permanent change in the chemical composition of the CIGS semiconductive optoelectronically active layer where the line segment via hole is drilled,
      forming of an electrically conductive path between at least one portion of the front-contact layer and at least one portion of the back-contact layer,
      forming of a front-contact bump-shaped raised portion at a surface of the front-contact layer along an edge of the inner surface of said line segment via hole, and
      forming a raised portion of the back-contact layer that is raised towards the front-contact layer.

2. The method according to claim 1, wherein forming the via hole causes removal of a portion of the back-contact layer within the via hole, thereby exposing a portion of substrate.

3. The method according to claim 1, wherein
   forming the via hole causes removal of a portion of the back-contact layer within the via hole, thereby exposing a portion of substrate, and forming the raised portion of the back-contact layer that is raised towards the front-contact layer comprises forming a gutter-shaped structure.

4. The method according to claim 3, wherein the gutter-shaped structure comprises a portion of the back-contact layer that curls over a portion of the CIGS-type wall.

5. The method according to claim 1, wherein forming the via hole is with at least one laser forming, on said thin-film CIGS device, a laser spot having an asymmetrical laser spot diagram.

6. The method according to claim 1, wherein the increase in the laser power during the drilling of the via hole comprises the progressive increase in laser power during a movement of a laser spot from the laser that is directed at the via hole.

7. The method according to claim 1, wherein drilling of the via hole forms, upon microscopic inspection when seen from a light exposed side of the device, an inner-surface of the CIGS-type alloy having an oval pattern that has a radius of curvature that is smaller at a first extremity corresponding to a beginning of the drilling of the line segment via hole than at a second extremity corresponding to an end of the drilling of the line segment via hole.

8. The method according to claim 1, wherein drilling the via hole by the laser comprises moving a laser spot from the laser such that a laser energy delivered to at least one portion of the via hole is between 1 J/m and 8 J/m.

9. The method according to claim 1, wherein drilling the via hole by the laser comprises an interval of time when a laser-provided fluence is in a range from $5 \times 10^8$ J/m$^2$ to $41 \times 10^8$ J/m$^2$.

10. The method according to claim 9, wherein drilling the via hole the laser comprises an interval of time when a laser-provided steady state fluence is in a range from $7.5 \times 10^8$ J/m$^2$ to $11 \times 10^8$ J/m$^2$.

11. The method according to claim 1 wherein, drilling the via hole is done at a same time as laser scribing an adjacent ablating line into the front-contact layer.

12. The method according to claim 1 wherein, forming said thin-film CIGS device further comprises forming a dashed line comprising a plurality of said line segment via holes in a region of said thin-film CIGS device.

13. A method of forming at least one thin-film Copper Indium Gallium Selenide (CIGS) device, comprising:
    forming a line segment via hole in a region of a thin-film CIGS device, the device comprising:
    a substrate;
    a front-contact layer disposed over the substrate;
    a back-contact layer disposed over the substrate; and
    a semiconductive optoelectronically active layer disposed between the front-contact layer and the back-contact layer, wherein the line segment via hole:
    is formed by drilling by use of an output of a laser,
    passes through at least one portion of the front-contact layer and the semiconductive optoelectronically active layer, and
    wherein drilling by the laser causes:
        the formation of a CIGS-type wall of electrically conductive, permanently metalized, copper-rich CIGS-type alloy, wherein the CIGS-type wall lines an inner surface of the line segment via hole, and forms an electrically conductive path between a portion of the front-contact layer and a portion of the back-contact layer, and
        the formation of a raised portion of the back-contact layer that raises up towards the front-contact layer to form a gutter-shaped structure.

14. The method according to claim 13, wherein the gutter-shaped structure is formed by a change in a power applied by the laser during the drilling of the line segment via hole.

15. The method according to claim 13, wherein the gutter-shaped structure is formed by a progressive increase in laser power applied to the line segment via hole from a first power level to a second power level during the drilling of the line segment via hole.

16. The method according to claim 13, wherein the gutter-shaped structure is formed by a progressive increase in laser power applied to the line segment via hole from a first power level to a second power level during a movement of a laser spot from the laser that is directed at the via hole.

17. The method according to claim 13, wherein the gutter-shaped structure comprises a portion of the back-contact layer that curls over a portion of the CIGS-type wall.

18. The method according to claim 13, wherein the CIGS-type wall includes a portion that extends above the front-contact layer.

19. The method according to claim 13, wherein
    the CIGS-type wall includes a portion that extends over the front-contact layer, and
    a portion of front-contact layer is disposed between a portion of the semiconductive optoelectronically active layer and the CIGS-type wall that extends over the front-contact layer.

20. The method according to claim 13, wherein the gutter-shaped structure comprises a portion of the back-contact layer that curls over a portion of the CIGS-type wall.

* * * * *